United States Patent [19]

Jones et al.

[11] Patent Number: 4,902,898
[45] Date of Patent: Feb. 20, 1990

[54] WAND OPTICS COLUMN AND ASSOCIATED ARRAY WAND AND CHARGED PARTICLE SOURCE

[75] Inventors: Gary W. Jones; Susan K. Schwartz Jones, both of Durham, N.C.

[73] Assignee: Microelectronics Center of North Carolina, Research Triangle Park, N.C.

[21] Appl. No.: 186,510

[22] Filed: Apr. 26, 1988

[51] Int. Cl.$^4$ ............................................. H01J 37/317
[52] U.S. Cl. ............................... 250/492.2; 250/396 R; 250/423 R; 313/545; 313/362.1; 315/111.81; 315/111.91
[58] Field of Search ........... 250/492.2, 492.23, 492.21, 250/492.22, 398, 396 R, 423 R; 313/545, 362.1; 315/111.81, 111.91

[56] References Cited

U.S. PATENT DOCUMENTS

| | | | |
|---|---|---|---|
| 3,753,022 | 8/1973 | Fraser | 313/78 |
| 3,921,022 | 11/1975 | Levine | 313/309 |
| 3,935,500 | 1/1976 | Oess et al. | 313/495 |
| 3,982,147 | 9/1976 | Redman | 313/309 |
| 4,498,952 | 2/1985 | Christensen | 250/396 R |
| 4,724,328 | 2/1988 | Lischke | 250/492.2 |
| 4,774,433 | 9/1988 | Ikebe et al. | 313/362.1 |

FOREIGN PATENT DOCUMENTS 58-94741  6/1983  Japan ............... 250/423 R

Primary Examiner—Jack I. Berman
Attorney, Agent, or Firm—Bell, Seltzer, Park & Gibson

[57] ABSTRACT

An array wand for charged particle beam shaping and control applications can selectively and accurately shape or deflect single or multiple beams of charged particles so as to delineate a desired pattern in a substrate. The wand preferably takes the form of a monolithic block of material, for example semiconductor material, having one or more cavities etched through it which serve to form a collimated beam of particles. The array wand employs an Einsel lens structure which contains electrostatic electrodes for precise focusing of the beams of charged particles. The Einsel lens includes successive layers on the monolithic substrate which simultaneously act as a lens, an aperture, and a beam line for beams of charged particles.

The array wand may be manufactured, in large quantity with precision, and may be employed to form small focused beams. An important application of the array wand is in microlithography where small precision beams of charged particles are used to write circuit patterns on various circuit substrates.

A monolithic ion source may be formed separate from the array wand or, in one embodiment, may be formed in combination with the array wand in monolithic form. The ion source has utility as a source of ions apart from its utilization in a wand optics column.

13 Claims, 7 Drawing Sheets

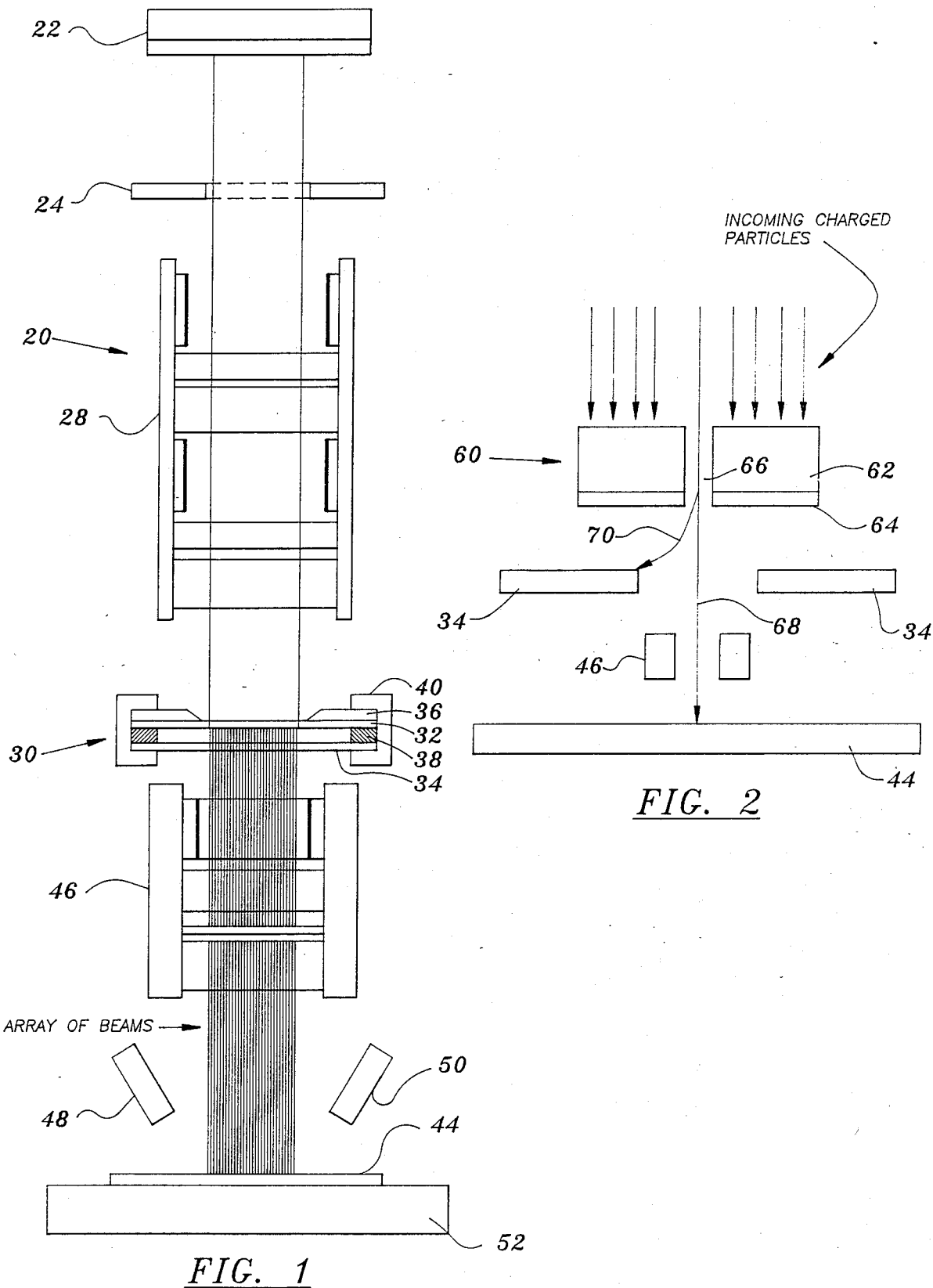

WAND OPTICS COLUMN AND ASSOCIATED ARRAY WAND AND CHARGED PARTICLE SOURCE

FIELD OF THE INVENTION

This invention relates to the exposure of various patterns on a target through the use of charged particle beams. The invention is suitable for use with microlithography, lithographic printing, selective ion implantation, selective material depositions or selective radiation damage of substrates used for electronic devices.

BACKGROUND OF THE INVENTION

Integrated circuit fabrication requires the delineation of accurate and precise patterns on substrates. These patterns define the area for doping and internal connections. Lithography is the process whereby a pattern is transferred into a reactive polymer film (a resist) and transfer of that pattern, via methods such as etching, into the underlying substrate. Several forms of lithographic strategies exist. These are short wavelength photolithography, x-ray lithography, electron beam lithography and ion beam lithography. The invention has its primary application to electron and ion beam lithography.

Electron beam lithography can achieve submicron pattern definition, is highly accurate and has low defect densities. The major problems with current electron beam methods are the low throughput density and high cost. Ion beam methods offer the advantage of improved resolution as ions do not scatter as much as electrons when passing through the resist. A major disadvantage of the ion beam method is also the slow speed of those systems in addition to the lack of stable sources with high currents.

Problems existing with prior lithographic systems include accuracy, speed and the amount of capital investment required. The instant invention with its novel structure improves lithography system performance in these areas.

Object and Summary Of The Invention

In one aspect, the instant invention is an array wand for charged particle beam shaping and control applications which can selectively and accurately shape or deflect single or multiple beams of charged particles so as to delineate a desired pattern in a substrate. The wand preferably takes the form of a monolithic block of semiconductor material having one or more cavities etched through it which serve to form the collimated beam of particles. The array wand may employ several optional features, one being an Einsel lens structure which contains electrostatic electrodes for precise focusing of the beams of charged particles. The Einsel lens includes successive layers on a monolithic substrate which simultaneously act as a lens, an aperture, and a beam line for beams of charged particles. The advantage of this type of structure is its ability to be manufactured, in large quantity, with precision coupled with its ability to form small focused beams. An important application of the array wand is in microlithography applications where small precision beams of charged particles are used to write circuit patterns on various circuit substrates.

The instant invention also provides a novel monolithic ion source. This ion source may be formed separate from the array wand or, in one embodiment, may be formed in combination with the array wand in monolithic form. The ion source has utility as a source of ions apart from its utilization in a wand optics column.

In yet another aspect, the invention may be viewed as an overall wand optics column that includes a source of charged particles (ions or electrons) for producing a ribbon of charge, prepositioning deflectors for adjusting the x,y,$\theta$ orientation of the ribbon, an array wand, positioning deflectors (x,y,$\theta$) for the array of beams emerging from the array wand and a target substrate and associated stepping table for the target.

In accordance with the foregoing, it is one object of the present invention to provide an assembly which has high resolution, and fast, accurate alignment capabilities for use in electron and ion beam lithography applications.

It is a further object of the present invention to provide an ion or electron beam deflection wand assembly which provides for the use of surface mounted conductors to deflect electron or ion beams.

Yet another object of the invention is to provide a monolithic ion source.

BRIEF DESCRIPTION OF THE DRAWINGS

FIG. 1 is a schematic representation of a wand optics column of the present invention;

FIG. 2 is a section view of a basic form of the array wand of the present invention;

DETAILED DESCRIPTION OF THE INVENTION

Figure 3A:
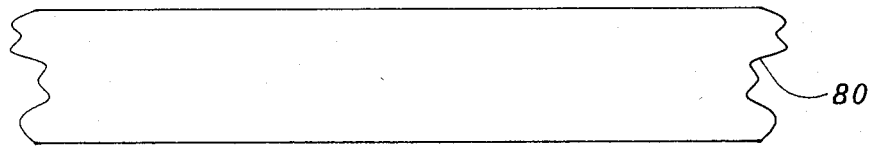
FIGS. 3A–3D show the fabrication steps for a modified array wand.

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Referring to FIG. 1, there is shown a schematic representation of a wand optics column 20 of the present invention. Wand optics column 20 includes a source of charged particles 22 in the form of an electron or ion source which supplies a ribbon of charged particles. The ribbon, as oriented in FIG. 1, is downwardly projected through an acceleration control means 24. The ribbon of charge is essentially in the form of a line of individually collimated beams of charged particles. Other geometries are also contemplated. Downstream of the acceleration control means are prepositioning deflectors 28 which take the form of charged plates that serve to adjust the x,y,$\theta$ orientation of the charge ribbon. Positioning deflectors 28 are mounted in a mechanical support which is controlled by a stepping stage or piezoelectric positioning means. The incoming charge of ribbon having been prepositioned and shaped by the prepositioning deflectors 28 is next incident upon the array wand assembly 30 which, in this illustrated embodiment, includes an array wand 32, a gettering aperture 34, a cooled back plate 36, a spacer 38, all of which are supported by support block 40. Support block 40 preferably includes x,y,$\theta$ mechanical control. As stated later in the specification in connection with the detailed description of the array wand, the incoming charge of ribbon is acted upon by the array wand assembly 30 to provide a precisely aligned array of collimated beams for delineating a desired pattern on the target substrate 44. The array of beams emerging from array wand assembly 30 may, in certain instances, proceed directly to the target substrate 44. However, in the embodiment illustrated in FIG. 1, an assembly 46 comprising x,y,$\theta$ positioning deflectors and an x scan deflector is positioned between the array wand assembly 30 and the target substrate 44 for the purpose of further controlling and shaping the array of beams incident upon the target substrate. A pair of detectors 48, 50 for secondary electrons are positioned between the assembly 46 and target substrate 44. The target substrate 44 is supported by a stepping table which, in the manner known in the art, is adapted to step the substrate as needed in the x or y direction during the writing operation.

It will be appreciated that in accordance with the preferred method of practicing the invention all components of the wand optics column 20, as illustrated in FIG. 1, are housed in a vacuum system. It will also be appreciated that assemblies 28 and 46 may be of a structure similar to deflector systems known in the art. Furthermore, the prepositioning deflectors are unnecessary if there is no concern about variations in the source output. Finally, the system must include some means for moving the target with respect to the array wand and emanating beams, whether by means of the positioning deflectors, moving the stage on which the target is mounted, or both.

Referring to FIG. 2, the description will now turn to a discussion of the array wand. FIG. 2 is a sectional view of the basic concept of the array wand of the invention. Reference numeral 60 refers to a portion of an array wand which includes a blocking layer 62 and a deflector layer 64. Blocking layer 62 is formed of a material that will effectively block the incoming charged particles (e.g., ions or electrons) which are being utilized. As explained in detail below, the blocking layer may be made from any number of materials to achieve the desired results for any particular system. The downstream surface of blocking layer 62 is joined to deflector layer 64 which is formed of a conductive material. The deflector layer is preferably deposited on the blocking layer. The array wand further includes an opening or aperture 66 that is etched through the blocking layer 62 and deflector layer 64 by techniques described in detail below. Stated simply, the blocking layer of the array wand serves to block the incoming charged particles while the aperture or apertures 66 serve to pass charged particles therethrough to form a collimated beam at each aperture.

In operation the collimated beam passing through aperture 66 may either be directed unimpeded downwardly to the target substrate 44 as shown by beam 68 or, through charging of deflector layer 64, may be deflected along the path of beam 70 to the gettering aperture 34.

A more detailed description of the fabrication, structure and operation of an array wand will now be discussed in connection with FIGS. 3A-3D.

Referring now to FIG. 3A, the array wand comprises a monolithic block of substrate material that serves as the blocking layer 80. Materials appropriate for use as the blocking layer include Molybdenum (Mo), Tungsten (W), Silicon (preferred choice), and silicon dioxide. It will be appreciated that increasing the thickness of the blocking layer improves beam collimation at the expense of the time required to fabricate the structure.

Figure 3B:
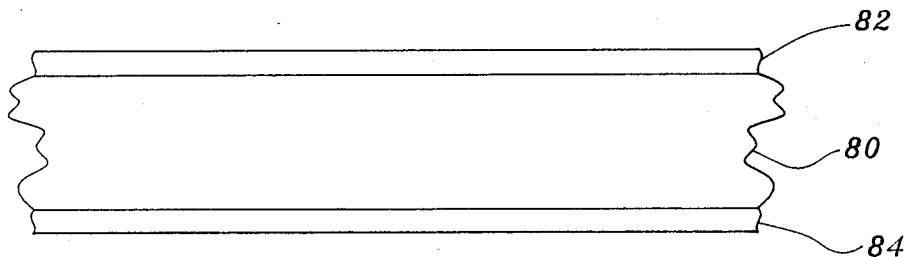

FIG. 3B shows the blocking layer 80 after insulator films 82,84 have been deposited or grown on each side of the blocking layer. Films 82,84 are insulators (e.g., $SiO_2$). Film 84 is optional in most cases but may be desired for stress control since the stress of like films on either side of the blocking material tend to cancel. Film 82 is not required if an insulating material is chosen (e.g., $SiO_2$) for blocking layer 80, but film 82 is required if the blocking layer is a conductor and for most cases if it is a doped semiconductor.

Figure 3C:
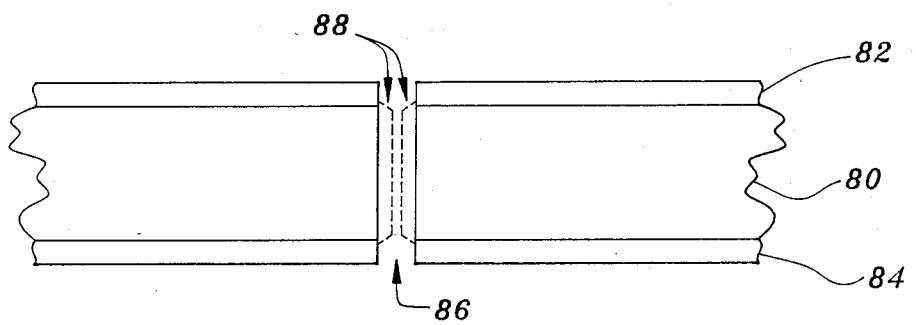

FIG. 3C shows the structure after apertures 86 are patterned and etched. First the surface is coated with a lithographic material and patterned using an available technique. The apertures are then etched using reactive ion etching (RIE) processes. Etch processes are available for each of the layers. Each layer is etched using a process best suited for that layer. (For example, blocking layer 80 can be silicon, layers 82 and 84 can be $SiO_2$). The remaining lithographic material may be subsequently removed using RIE and/or chemical stripping processes which are also known to those skilled in the art. A restrictor 88 (shown as dotted lines in FIG. 3C) may optionally be formed to reduce the aperture diameter and subsequent particle beam diameter. The purpose of the restrictor is to provide substantially greater collimation for beam with the need of reducing the opening size of the entire aperture 86. Two example methods for forming the restrictor follow.

The first method for forming the restrictor is a CVD (Chemical Vapor Deposition) and RIE method. According to this method a thin film of a CYD material (e.g., $SiO_2$) is deposited on the blocking layer 80 and simultaneously in the aperture 86 (example reaction: $SiH_2Cl_2 + N_2O$ at 900° C. and 5 Torr). The CVD material is then anisotropically reactively ion etched (RIE) using techniques known to those of skill in the art to leave a sidewall of the restricting CVD material in the aperture. Final aperture diameter is determined by the final thickness of the restrictor. The restrictor may be etched from both sides if desired to expose the backside metal (discussed below).

The second method for forming the restrictor is by "sidewall growth." According to this method a chemical process must take place which increases the volume of the aperture wall. An example is to use a blocking layer of silicon and perform an oxidation process (e.g., 1000° C. in steam at atmospheric pressure) to form $SiO_2$. The duration of the oxidation process determines the restrictor wall thickness. In this example of a restrictor formed by oxidation sidewall growth, a CVD silicon nitride film could be deposited prior to the lithography process to prevent the formation of additional $SiO_2$ in areas other than the aperture.

Figure 3D:
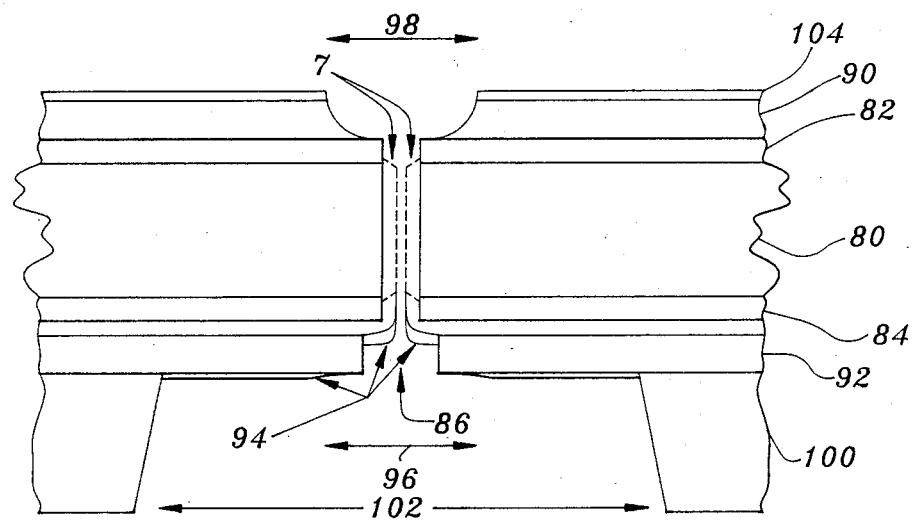

FIG. 3D shows the final array wand structure with optional restrictor. Following sidewall formation, a lithographic process is performed to create a "lift off" structure in the manner known in the art. Following the coating of the surface of film 82 with the lithographic material and subsequent processing, a conductor 90 is deposited using available techniques (such as evaporation in a vacuum) in between the openings in the lithographic material and on top the lithographic material. The lithographic material is subsequently removed along with the conductor on top the lithographic material leaving just the conductor lines which run left and right from each aperture. The conductor may be of a material with good adhesive to layer 82 and good conductivity such as aluminum, titanium, silicide, and tungsten for example. These lines enable individual control of the beam emanating from each aperture of the array wand. By placing a voltage between a left line and right line, an electric field is produced across the aperture which can be used to deflect charged particles passing through the aperture and between the conductive lines. This capability is an important feature of this aspect of the invention. This structure allows many such beams to simultaneously be shaped and controlled independently. It is desirable that the aperture site be less than the lithographic material thickness as the shape of the ends of the array lines is important for certain applications. As stated above, FIG. 3B shows an optional dielectric coating 84 which can help control fields and provide protection to the conductive lines 90.

An optional backside conductor 92 may be included in the array wand in a similar way as dielectric coating 84, but unless it is also used for deflection, it need only provide an opening at the aperture.

A conductive thin film designated as 94 is optional and may be deposited if a restrictor which can charge is used and deflections from that charging are important for the application. Thin film conductor 94 may be deposited using any number of techniques available (i.e., evaporation or sputter) to provide a conductive plane from conductive layer 92 to the edge of the aperture. This film 94 can also be used as a restrictor if deposited thicker than shown in the drawing. Reference numerals 96 and 98 designate openings in the metal films 90 and 92, respectively.

An optional backside support is shown as 100. For many applications such a backside support is desirable to aid in handling, support of the final wand, and removal of heat generated by the incoming particle beam. FIG. 3D shows the backside support 100 attached after processing to the back of the wand. In an array wand incorporating a silicon blocking layer 80, both the backside support 100 and the blocking layer could be formed from the same piece of material in which case the films 90 and 92 would not be between support 100 and layer 80, but would be on the outside surface of support 100. Reference numeral 102 denotes the opening slot in the backside support 100.

Reference numeral 104 denotes an optional insulator layer.

Figure 4:
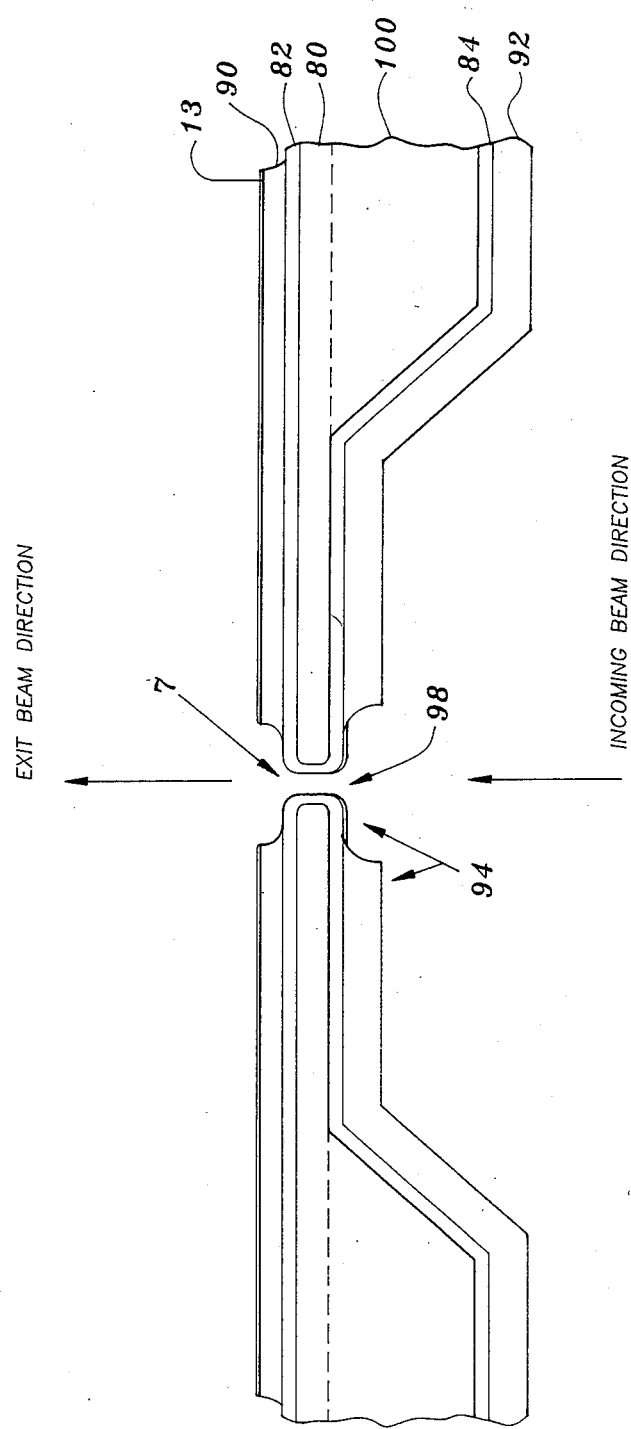
FIG. 4 illustrates an array wand fabricated with a silicon crystal substrate.

A version of this type structure fabricated from a silicon crystal substrate is shown in FIG. 4. In this embodiment blocking layer 80 and backside support 100 begin as one substrate and the blocking layer 80 is preferably formed by heavy $10^{20+}$ boron doping. A chemically selective etch is performed from the backside which slows considerably when it reaches the high boron layer 80. This can be ethylene diamine syrocatecal plus syrazine etch for silicon which is known in the art. Other processing is similar to that of the prior example of FIGS. 3A-3D.

The use of a semiconductor material for the substrate such as a single crystal silicon offers much processing flexibility due to the large quantity of available processing literature and equipment. It also offers the possibility of placing control circuitry directly on the array wand's periphery.

Figure 5A:
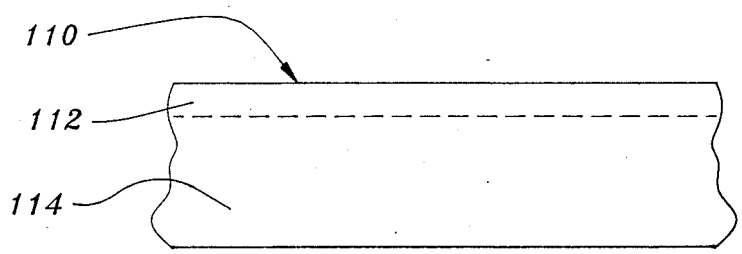
FIGS. 5A–5I show the fabrication steps for an array wand with an Einsel lens.

Referring to FIG. 5A-5I, the fabrication steps for an array wand with an Einsel lens are shown. In FIG. 5A, a blocking layer or substrate 110 is selected and is boron doped using boron nitride wafers in a steam furnace at a temperature on the order of 900° C. The boron is annealed or driven to a desired depth, approximately 2 micrometers as shown at 112. The remaining portion 114 of the Si substrate is polysilicon. The concentration of boron in the silicon wafer preferably is approximately $10^{21}$. Preferably, the annealing process would occur at a temperature on the order of 1000° C. in an atmosphere of $O_2$ and Ar.

Figure 5B:
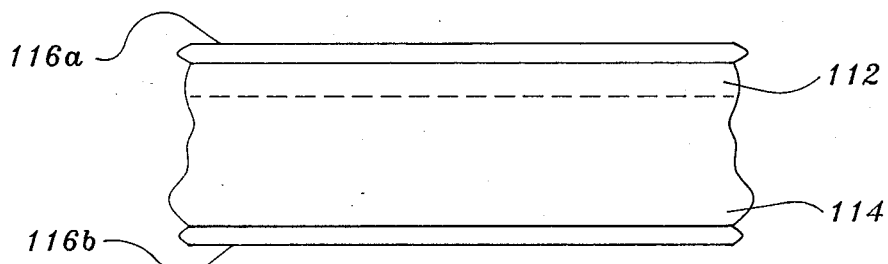

The next step, as shown in FIG. 5B, is the growth of insulator layers 116a and 116b (preferably silicon dioxide) on both the front and back sides of the substrate. The insulator layers may be approximately 0.2 micrometers in depth. The insulator layers are then oxidized at a temperature on the order of 1000° C. in an $H_2O$ plus $O_2$ atmosphere.

Figure 5C:
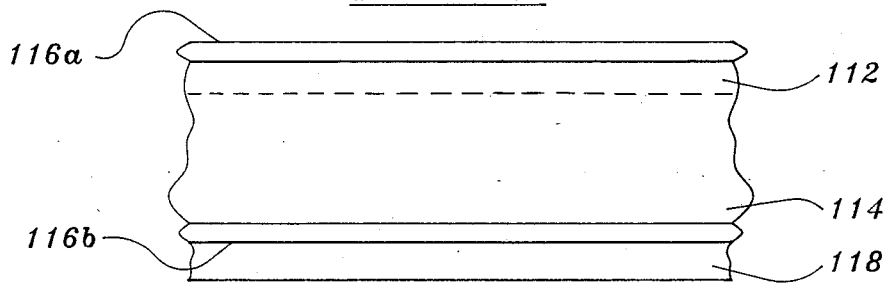
Figure 5D:
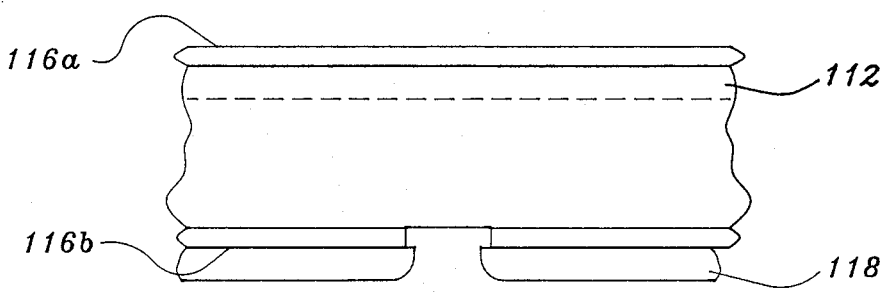

Referring to FIGS. 5C and 5D, the substrate is patterned using available photolithography techniques known to those skilled in the art, such as contact printing. A photoresist layer 118 is placed on the silicon dioxide layer on the back side of the substrate. The photoresist and the silicon dioxide is wet etched in a buffered oxide etchant (BOE) and the photoresist is stripped.

Figure 5E:
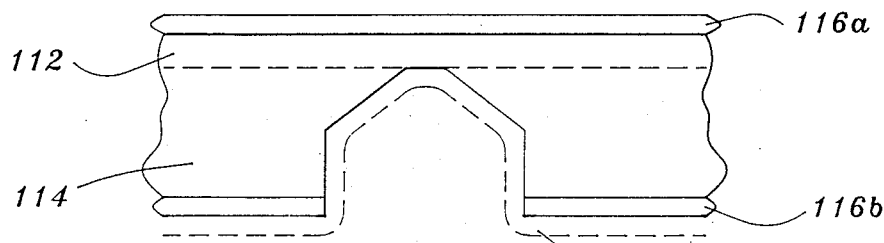

Referring now to FIG. 5E, using an ethylene diamine pyrocatacol (EDPH) etch with pyrazine, the silicon is etched. The etch will slow down on the heavily boron doped material 112. Other etching methods slowing down at the upper $SiO_2$ layer 116a are also acceptable which would eliminate the requirement of the heavily boron doped surface layer. The backside conductor 120 can be placed on the lens at this point using known sputter, CVD, PECVD or evaporation techniques.

Figure 5F:
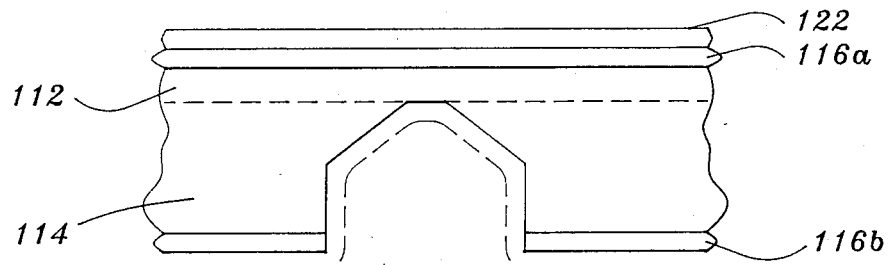

In the step shown in FIG. 5F, a layer of N+ polysilicon or any other suitable conductor 122 such as $TiSi_2$ is deposited on the front side of the substrate using sputter, CVD, PECVD or evaporation techniques.

Figure 5G:
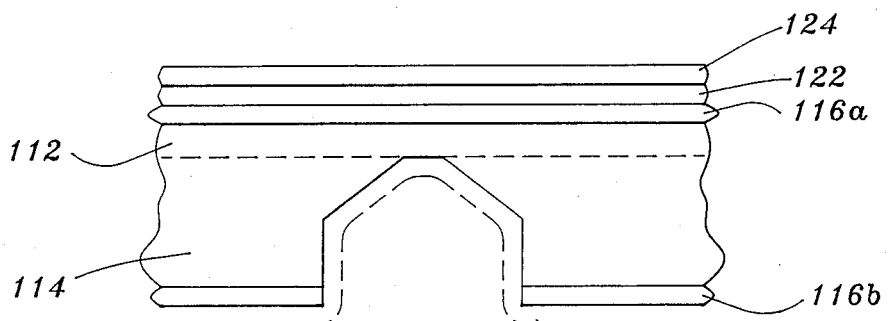

Referring now to FIG. 5G, an insulator layer 124 such as silicon dioxide or any other suitable insulator is deposited on the front side using the same techniques as used with the conducting layer 122.

Figure 5H:
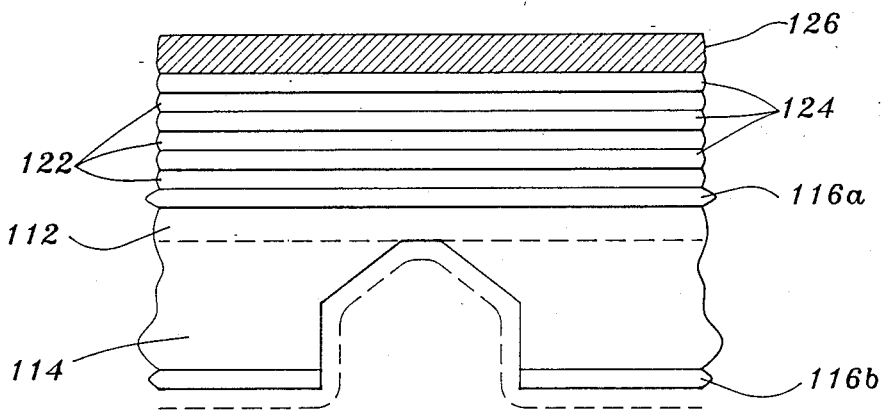

In FIG. 5H, the results of depositing alternating layers of conducting layers 122 and insulating layers 124 is seen. (As stated above, any conducting or insulating material can be employed, but typically N+polysilicon is used for the conducting layer.) While not a requirement, it is desirable that the poles of the Einsel lens be located on both sides of the substrate to prevent buckling of the monolithic structure. Also, it will be appreciated that the multilayer structure of the Einsel lens adds structural integrity to the monolithic structure and increases the ion blocking effectiveness of the device.

FIG. 5H shows the top conductor 126 for the deflectors which can be deposited at this stage.

Figure 5I:
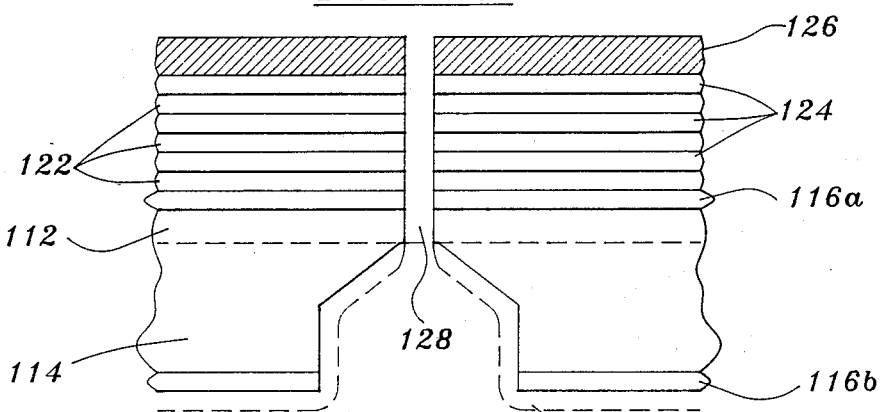

Referring now to FIG. 5I, the front side of the device is patterned to form a beam line 128, in this case, a small circle. The pattern should also open areas for subsequent electrical connection some distance away from the beam line. Using alternating anisotropic reactive ion etch techniques, beam line 128 is etched through all layers to penetrate the substrate from the front side. Finally, the remaining photo resist is stripped and each of the exposed polysilicon layers is connected to the desired power supplies to form an Einsel focusing lens.

The Einsel lens of FIGS. 5A-5I can greatly increase the current density of the ion beam and thereby increase the writing speed of the system. As an example, with an aperture opening of 2 micron diameter, an Einsel lens as described above can serve to focus the beam to, say, 0.1 micron, a reduction of twenty fold.

The preferred concentrations for the etches noted above are as follows:

| Substance | Concentration |
|---|---|
| (1) Ethyline Diamine Pyrocatacol (EDPH) etch | |
| $H_2O$ | 700 milliliters |
| Ethylene Dramine | 2250 milliliters |
| Pyrocatechol | 360 grams |
| Pyrazine | 13.3 grams |
| Time - 6 hours | |
| Temperature - 80° C. | |
| (2) Buffered Oxide Etchant (BOE) etch | |
| 40% $NH_4F$ in Water | 10 parts |
| 49% HF in Water | 1 part |
| (3) Hydrogen Flouride (HF) Dip | |
| Water | 50 parts |
| 49% HF | 1 part |
| (4) Stripping of Resist at 100-140° C. | |
| $H_2SO_4$ | 10 parts |
| $H_2O_2$ | 1 part |

Figure 6:
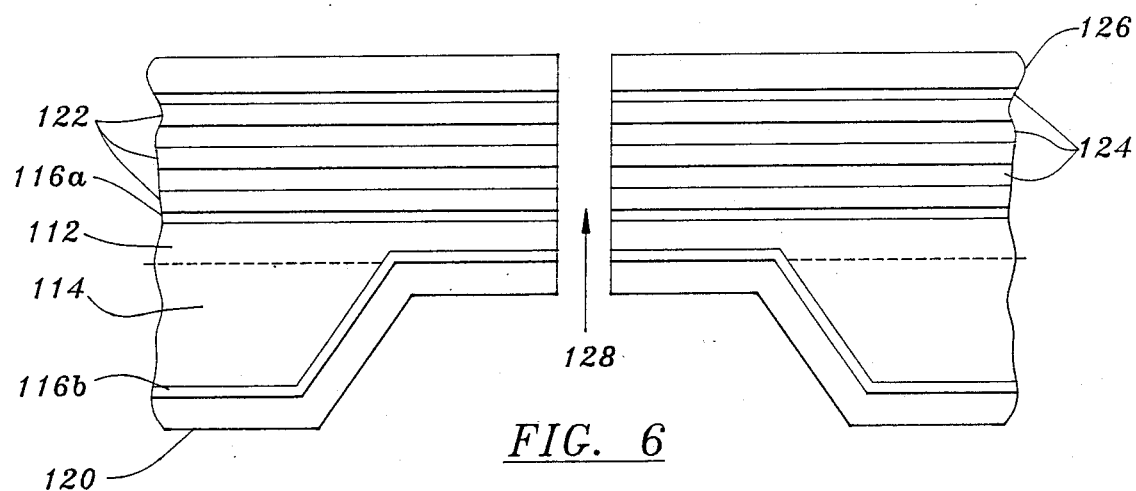
FIG. 6 is a section view of an array wand incorporating a four ring Einsel lens.

Referring now to FIG. 6, a cross-section of an array wand incorporating a four ring Einsel lens is shown. Processing is similar to that discussed in connection with FIGS. 5A-5I. The wand of FIG. 6 is built from successive films deposited on a monolithic substrate. First, a silicon substrate doped with little or no boron is selected. Preferably, the boron concentration is under $10^{14}$ atoms per cubic centimeter (cc). Next, the substrate is oxidized to form a layer of silicon dioxide. Preferably, the oxidation occurs at a temperature on the order of 1000° C. and the oxide layer is preferably 0.5 micrometers deep. A layer of $Si_3N_4$ is deposited on the backside of the substrate using plasma chemical vapor deposition (CVD) of the wafer. Preferably, this layer is approximately 0.2 micrometers thick. The wafers are then boron doped using boron nitride wafers in a steam furnace at a temperature on the order of 900° C. The boron is then annealed or driven to a desired depth in the wafer. The boron is preferably driven to 2 micrometers. This preferably occurs in an $O_2$ atmosphere at 1000° C. The structure of FIG. 6 simultaneously can act as a lens, aperture, and beam line for beams of charged particles.

Figure 7:
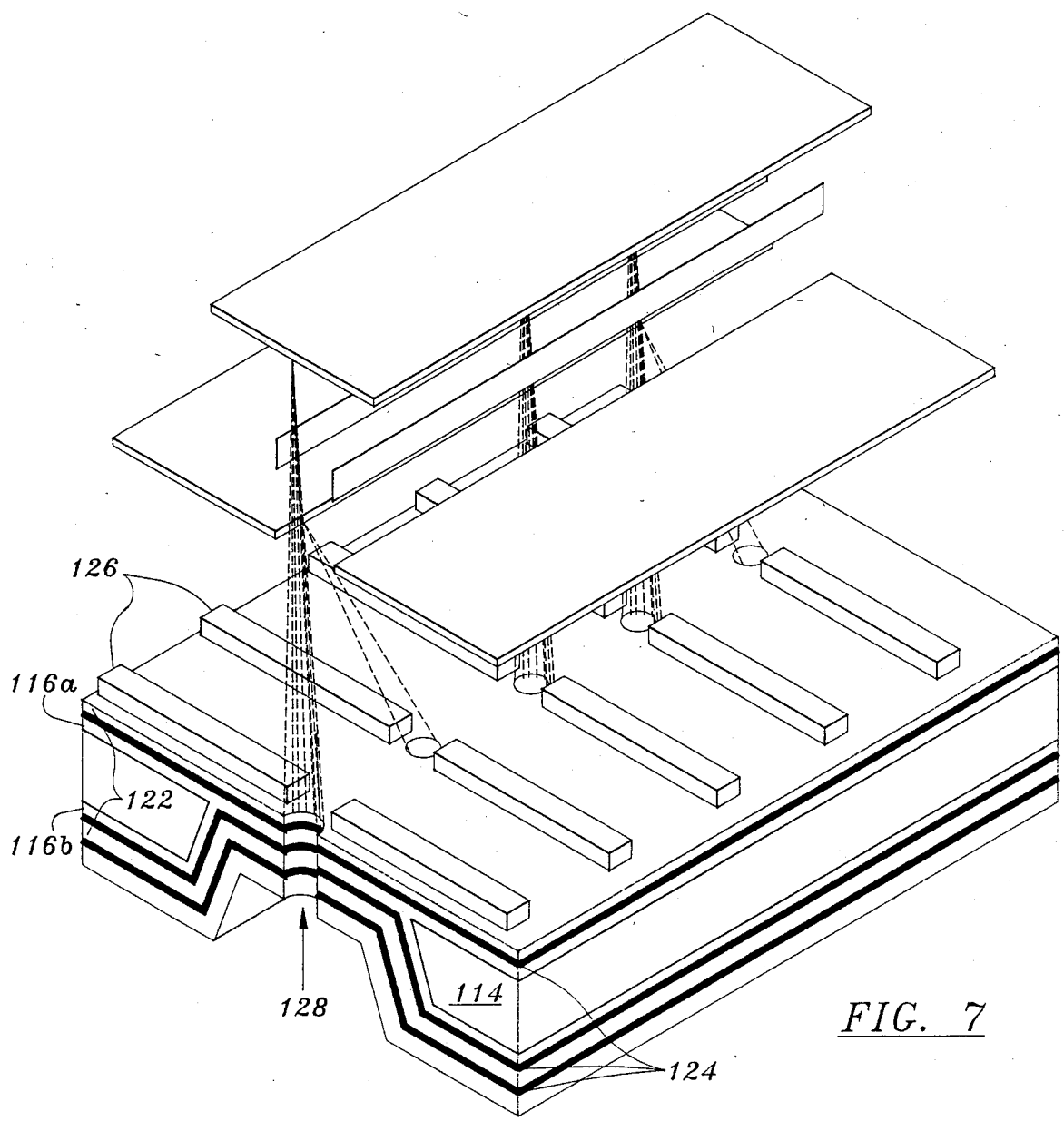
FIG. 7 is a pictorial view of an array wand similar to that shown in FIG. 6 in operative association with a gettering aperture and target substrate.

FIG. 7 illustrates in pictorial fashion for purposes of clarity the use of a wand similar to that shown in FIGS. 5A-5I and 6 in association with the gettering aperture, positioning deflectors and target of a wand optics column.

Figure 8:
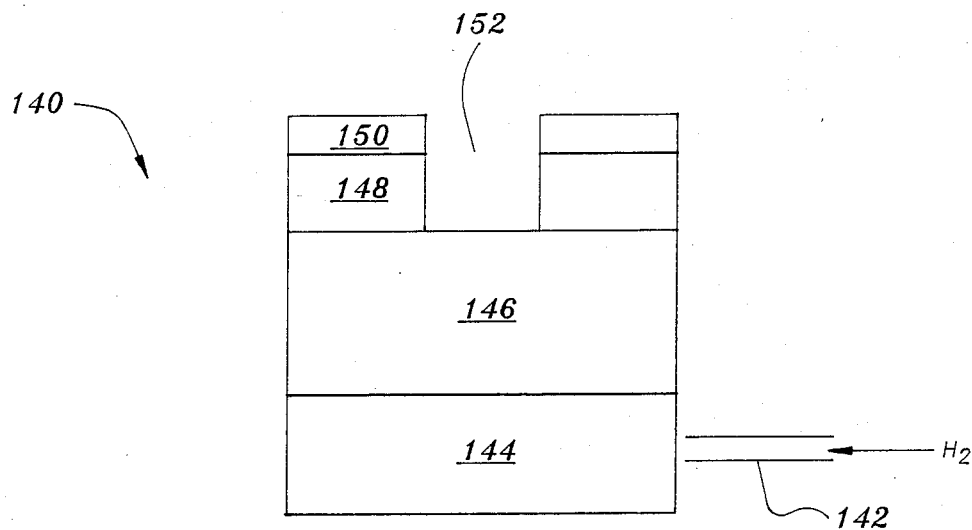
FIG. 8 is a section view of a monolithic ion source constructed in accordance with the present invention.

Referring to FIG. 8, an ion source 140 for generating patterned hydrogen ions is shown. Ion source 140 includes an input line 142 for hydrogen gas, a hydrogen gas chamber 144, a paladium substrate 146, a blocking layer 148 and an extraction electrode 150. An aperture 152 is formed by etching through layers 148 and 150.

Further details of the structure of ion source 140 and its operation follows. Hydrogen is supplied through line 142 to the gas chamber 144. The gas in chamber in 144 is maintained in a pressure higher than that in aperture 152 on the opposite side of the substrate 146. As an example, the pressure in chamber 144 may be atmospheric while that on the opposite side of substrate 146 may be on the order of $10^{31\ 6}$ Torr. Substrate 146 is formed from a solid non-porous material which will diffuse hydrogen. Palladium, preferably in a single crystal form for optimum mobility, is selected for the embodiment illustrated in FIG. 8. Gas chamber 144 is physically connected to the palladium substrate in such a fashion that the gas in chamber 144 is substantially exposed to the palladium throughout the interface between chamber 144 and substrate 146. The blocking layer 148 is deposited on substrate 146. The material for blocking layer 148 is chosen as to be an effective barrier against migration of hydrogen ions so that the ions exiting substrate 146 do so only through aperture 152. $SiO_2$ or $Si_3N_4$ are materials of choice for the blocking layer 148. The extraction electrode 150 is connected to a power supply so that it can be electrically charged to draw the hydrogen ions from substrate 146 when a high electric field is placed across the electrode. Extraction electrode 150 may be formed of any suitable conductor in a single or multiple layers. A bilayer electrode formed of a 50nm layer of silicon and 500nm layer of titanium (or N+ polysilicon) is suitable.

In operation, hydrogen gas is supplied to gas chamber 144 and diffuses through substrate 146 to aperture 152. A voltage is applied to extraction electrode 150 creating an electric field which extracts the hydrogen ions from the substrate and directs them through aperture 152. Monoatomic hydrogen is removed from substrate 146 as ions by thermal energy and low energy electron impact and these protons are subsequently accelerated away from the substrate surface by the electric field. In the embodiment illustrated in FIG. 8, the aperture 152 is a slit which produces a ribbon of charged particles; of course, other geometries may be employed.

In the embodiment illustrated in FIG. 8, the thickness of the palladium substrate is on the order of 1.0 mm and a single crystal palladium material is preferred but is not deemed essential. The thickness of the blocking layer may be on the order of 3000nm and the width of aperture 112 may be on the order of 2-3 microns. It has been found that a potential on the order of $10^9$ volts/meter or greater is desirable for proper acceleration of the protons emanating from the ion source of FIG. 8. Given a blocking layer thickness of 3000nm (3 microns) a potential on the order of 3000 volts provided by extraction electrode 110 is desirable.

While not illustrated, for certain applications the palladium substrate may be replaced by a support with a thin membrane of palladium thereon.

It will be appreciated that the ion source may be formed of other materials for generation and accelerations of ions other than hydrogen ions.

Figure 9:
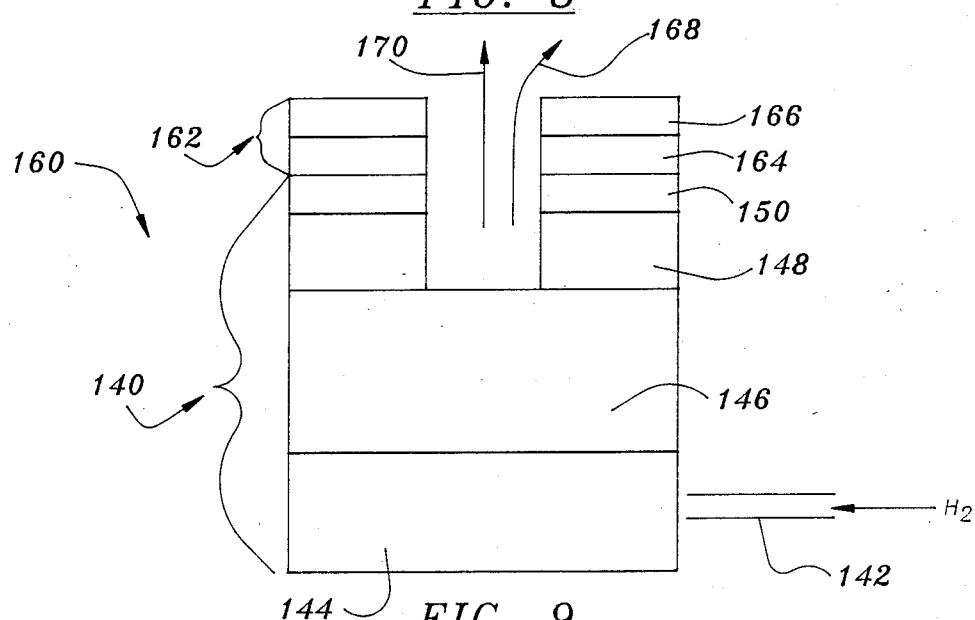
FIG. 9 is a section view of the ion source of FIG. 8 joined in monolithic fashion to an array wand to form a combination ion source/array wand.

FIG. 9 illustrates a combination ion source/array wand 160 in monolithic form. The ion source portion of the monolithic structure is substantially similar to the ion source 140 illustrated in FIG. 8. As mentioned above, this ion source provides a ribbon of high energy protons. The combination structure is formed by growing or depositing an insulating layer 164 on extraction electrode 150 and growing or depositing a deflecting electrode 166 on top of the insulating layer. Thus, protons (or other ions) emanating from the ion source 140 may be deflected by deflector layer 166 as generally shown by the arrow 168 or may be permitted to pass unimpeded as shown by the arrow 170.

Figure 10:
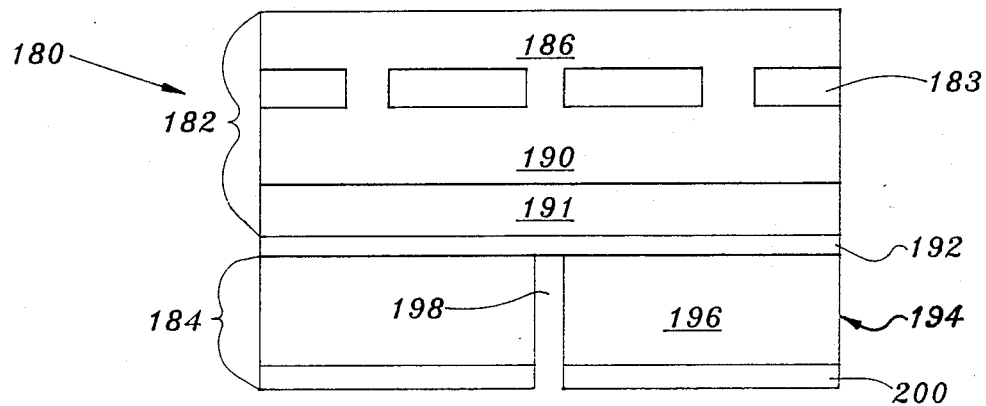
FIG. 10 is a section view of another form of a combination ion source/array wand.

Referring now to FIG. 10, there is shown in cross section another ion source/array wand combination 180 comprising an ion source 182 in association with an array wand 184. Ion source 182 comprises a gas distribution chamber 186 to which a gas such as hydrogen or helium is supplied. The gas passes from chamber 186 through a perforated slab 188 to thereby distribute the gas into an ionization chamber 190. The ionized gas is accelerated by an electric grid 191 and diffuses through a substrate 192 which may be of any material which will easily pass the ionized gas, e.g., hydrogen or helium. The ionized gas diffuses through substrate 192 due to its permeability and a high differential pressure which is maintained between chamber 190 and a high vacuum region 194 maintained on the opposite side of substrate 192. Substrate 192 permits free flow of the ionized gas, yet restricts the flow on nonionized gas. The ionized gas generated by ion source 182 is incident upon the blocking layer 196 of the array wand 184. The array wand operates in the fashion described above such that a collimated beam or ribbon of ionized gas emerges through aperture 198 and is subject to being deflected by deflector layer 200 or permitted to pass unimpeded.

Scanning and Alignment Example

The array wand is designed to be mounted in a vacuum system between a source of charged particles and a target. As shown in FIG. 1, optional apertures or deflection systems for beams incoming to or exiting the wand can be useful for simplified beam prealignment, alignment, mass/energy selection, and scanning. Scanning of the entire array of beams with a deflection system such as electrostatic deflector plates can reduce the requirements of mechanical stage motion accuracy during exposure. Typically the system would be used to scan small target fields of up to a few centimeters (larger or smaller fields are possible also).

Pattern generation can be produced by scanning the array of beams in one direction (x) by deflecting or not deflecting individual beams with the wand to produce a pattern of pixels. The beam array is shifted by one pixel in the direction 90°(y) to the scan, then the next set of pixels is scanned. This sequence is repeated until the area between the first pass pixel rows have been printed with the desired pattern. For instance, if the distance between aperture centers on the wand is 3 um and the beam spot site at the target is 0.1 um, then 30 scans in the x direction are required along with 29 tenth micrometer shifts in the y direction to write an entire pattern. An advantage of this type of printing system is the ease with which it lends itself to alignment. For example, the wand can be scanned with all but one beam deflected to the off position across a section of the array to either create an image of the target pattern from detected secondary electrons as is done in scanning electron microscopy or by scanning the beam across a specialized series of previously patterned structural pixel sequences. The resulting secondary electron signal would provide information to designate the scanned beam position for a given combination of deflection voltages, the deflection voltages can then be changed to correct for any misalignment repeatedly until the scanned beam produces the desired alignment signal indicating proper alignment. Beams at each end of the array wand can be used to align in x,y, and θ. Other beams within the wand could be used likewise to provide alignment signals as required. A wand with a built on lens can be used to vary final spot size. The spot size can also be determined from the secondary electron signal produced as the beam is scanned across pixels of known size and separation distance and then iteratively corrected as desired.

High effective beam currents due to multiple beam use, fast exposure capability, high resolution potential, ultra fast and accurate alignment potential, excellent potential for automated setup and operation, and highly parallel data input allowing use of much simpler data transfer systems make the present invention an exceptionally interesting and useful design concept.

While certain embodiments of this invention have been discussed herein, it will be appreciated that modifications may be made without departing from the true spirit and scope of the invention.

That which is claimed is:

1. A wand optics column for the exposure of patterns on a target through the use of charged particle beams, said column comprising:

a charged particle source for supplying a charge of electrons or ions;

a monolithic multilayer array wand positioned downstream of said charged particle source, said monolithic multilayer array wand including an integrated blocking layer formed of a material that will block the incoming charged particles, an integrated conductive deflector layer, at least one integrated lens layer and at least one aperture formed through the integrated blocking, deflector and lens layers in substantially parallel alignment to the path of the incoming charged particles, said aperture providing a collimated beam of charged particles passing therethrough;

said integrated deflector layer providing a primary conductive path for switching voltages for shaping, controlling and deflecting the individual beams passing through the associated apertures; and said at least one integrated lens layer focusing said collimated beam of charged particles.

2. The monolithic multilayer wand optics column of claim 1 wherein said at least one integratd lens layer comprises at least one pair of alternating integrated layers of insulating material and conducting material.

3. The monolithic multilayer wand optics column of claim 1 wherein said aperture includes a restrictor for blocking at least a portion thereof, to thereby narrow said collimated beam.

4. The monolithic multilayer wand optics column of claim 1 wherein said aperture includes a restrictor for shaping at least a portion thereof to thereby shape said collimated beam.

5. A monolithic multilayer array wand including a blocking layer formed of a material that will block incident charged particles, an integrated conductive deflector layer, at least one integrated lens layer and at least one aperture formed through the integrated blocking, deflector and lens layers in substantially parallel alignment to the path of the incident charged particles, said aperture providing a collimated beam of charged particles passing therethrough;

said integrated deflector layer providing a primary conductive path for switching voltages for shaping, controlling and deflecting the individual beams passing through the associated apertures; and said at least one integrated lens layer focusing said collimated beams of charged particles.

6. The monolithic multilayer array wand as claimed in claim 5 including means operatively associated with said aperture for capturing the charged particles deflected by said integrated deflector layer while permitting undeflected particles to pass on to the target, and further including means for controlling the charge applied to the integrated deflector layer.

7. The monolithic multilayer wand optics column of claim 5 wherein a charged particle source is mounted on said monolithic multilayer array wand.

8. A monolithic multilayer ion source comprising:

a gas chamber for containing gas to be ionized and accelerated by said ion source, said gas chamber having means for maintaining the gas at a first pressure $P_1$;

an integrated substrate having a first face in communication with the gas in said gas chamber, said integrated substrate being formed of a material that is permeable to the gas;

an integrated blocking layer on a second face of said substrate opposite the gas chamber, said integrated blocking layer being formed of a material that will block the flow of the gas or ions thereof;

an integrated extraction electrode on the face of the integrated blocking layer remote from said substrate, said integrated extraction electrode having associated means for supplying an electric potential thereto;

an aperture formed through said integrated blocking layer and extraction electrode and in communication with said substrate and means for maintaining the pressure in the aperture at a second pressure $P_2$, where Phd 1 is greater than $P_2$;

whereby gas from said chamber passes through said integrated substrate due to the pressure differential between $P_1$ and $P_2$, and ions thereof are accelerated from the surface from the substrate by said integrated extraction electrode for establishing a flow of ions through and out of said aperture.

9. The monolithic multilayer ion source of claim 8 wherein a monolithic multilayer array wand is mounted on said ion source.

10. A monolithic multilayer wand optics column and ion source for the exposure of pattern on a target through the use of ion beams, said column comprising:

a monolithic multilayer ion source having a gas chamber for containing gas to be ionized and accelerated by said ion source, said gas chamber having means for maintaining the gas at first pressure $P_1$;

an integrated substrate having a first face in communication with the gas in said gas chamber, said integrated substrate being formed of a material that is permeable to the gas;

an integrated blocking layer on a second face of said integrated substrate opposite the gas chamber, said integrated blocking layer being formed of a material that will block the flow of the gas or ions thereof;

an integrated extraction electrode on the face of the integrated blocking layer remote from said integrated substrate, and integrated blocking electrode having associated means for supplying an electrode potential thereto;

an aperture formed through said integrated blocking layer and extraction electrode and in communication with said integrated substrate and means for maintaining the pressure in the aperture at a second pressure $P_2$, where $P_1$ is greater than $P_2$;

whereby gas from said chamber passes through said integrated substrate due to the pressure differential between $P_1$ and $P_2$, and ions thereof are accelerated from the surface of the integrated substrate by said extraction electrode for establishing a flow of ions through and out of said aperture;

a monolithic multilayer array wand mounted on said monolithic multilayer ion source, said monolithic multilayer array wand including an integrated conductive deflector layer, at least one integrated lens layer and at least one aperture formed through the integrated blocking, deflector and lens layers in substantially parallel alignment to the path of the incoming ions, said aperture providing a collimated beam of ions passing therethrough, said monolithic multilayer array wand including an integrated lens for focusing said collimated beams of ions;

said integrated deflector providing a primary conductive path for switching voltages or shaping, controlling and deflecting the individual beams passing through the associated apertures; and said at least one integrated lens layer focusing said collimated beams of ions.

11. The monolithic multilayer wand optics column of claim 10 wherein said integrated lens comprises:

alternating integrated layers of insulating material and conducting material.

12. The monolithic multilayer wand optics column of claim 10 wherein said aperture includes a restrictor for blocking at least a portion thereof, to thereby narrow said collimated beams.

13. The monolithic multilayer wand optics column of claim 10 wherein said aperture includes a restrictor for shaping at least a portion thereof, to thereby shape said collimated beam.

* * * * *

UNITED STATES PATENT AND TRADEMARK OFFICE
CERTIFICATE OF CORRECTION

PATENT NO. : 4,902,898

DATED : February 20, 1990

INVENTOR(S) : Jones et al.

It is certified that error appears in the above-identified patent and that said Letters Patent is hereby corrected as shown below:

Column 4, line 50, "CYD" should be --CVD--

Column 6, lines 4 and 5, "syrocatecal" should be --pyrocatecol--

Column 6, line 5, "syrazine" should be --pyrazine--

Column 8, line 11, "$10^{31\ 6}$" should be --$10^{-6}$--

Column 11, line 38, "Phd 1" should be --$P_1$--

Column 11, line 49, "pattern" should be --patterns--

Signed and Sealed this

Second Day of April, 1991

Attest:

HARRY F. MANBECK, JR.

Attesting Officer

Commissioner of Patents and Trademarks